United States Patent [19]

Ugon

[11] 4,264,917
[45] Apr. 28, 1981

[54] FLAT PACKAGE FOR INTEGRATED CIRCUIT DEVICES

[75] Inventor: Michel Ugon, Plaisir, France

[73] Assignee: Compagnie Internationale pour l'Informatique CII-Honeywell Bull, Paris, France

[21] Appl. No.: 69,253

[22] Filed: Aug. 24, 1979

[30] Foreign Application Priority Data

Oct. 19, 1978 [FR] France .................................. 78 29844

[51] Int. Cl.³ ..................... H01L 23/02; H01L 23/12; H01L 23/16
[52] U.S. Cl. ......................................... 357/74; 357/72; 357/75; 357/80; 174/52 PE; 174/52 S; 174/52 FP; 29/588
[58] Field of Search ....................... 357/72, 74, 75, 80; 29/588, 589; 174/52 PE, 52 S, 52 FP

[56] References Cited

U.S. PATENT DOCUMENTS

| | | | |
|---|---|---|---|
| 3,777,220 | 12/1973 | Tatusko ................................... | 357/80 |
| 3,832,769 | 9/1974 | Olyphant ................................ | 29/589 |
| 3,868,724 | 2/1975 | Perrino ................................... | 357/80 |
| 3,886,581 | 5/1975 | Katsumura et al. .................... | 357/75 |

OTHER PUBLICATIONS

IBM Technical Bulletin by Iafrate, vol. 15, No. 4, Sep. 1972, p. 128.

Primary Examiner—Andrew J. James
Attorney, Agent, or Firm—Kerkam, Stowell, Kondracki & Clarke

[57] ABSTRACT

According to the present invention, a flat package for at least one integrated circuit device having output pads comprises a supporting member for the IC device, a plurality of output terminals external to the package, an array of conductors connecting the said output terminals to the said output pads of the device, and a protective means. The supporting member is a wafer and the output terminals of the package are contact islands arranged on the said wafer. At least those conductors belonging to the array which are attached to the said contact islands rest on the said supporting wafer, and the protective means comprises an electrically insulating encapsulation which partly covers the supporting wafer and which leaves exposed at least the contact islands.

15 Claims, 8 Drawing Figures

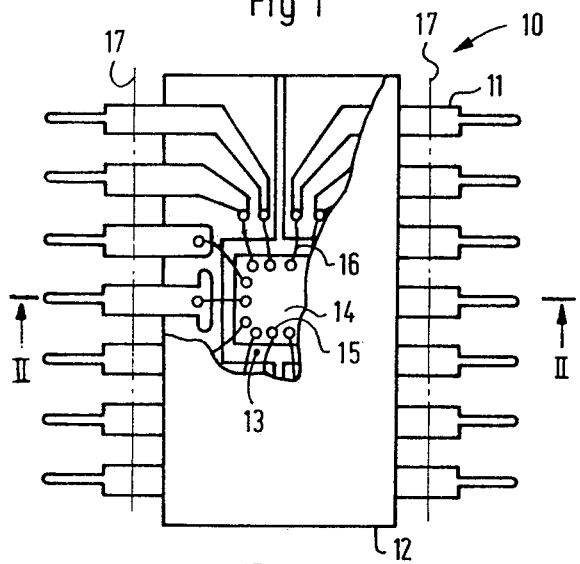
Fig 1
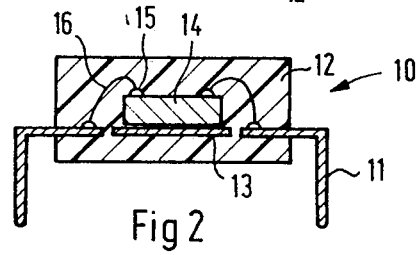
Fig 2
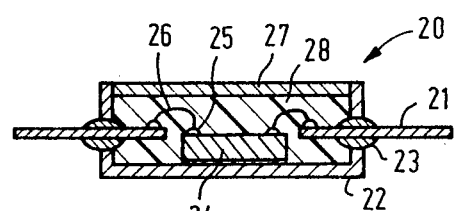
Fig 3
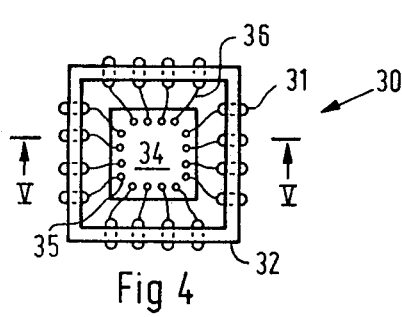
Fig 4
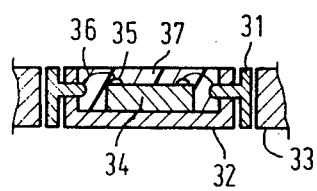
Fig 5
PRIOR ART
FIGS 1-5

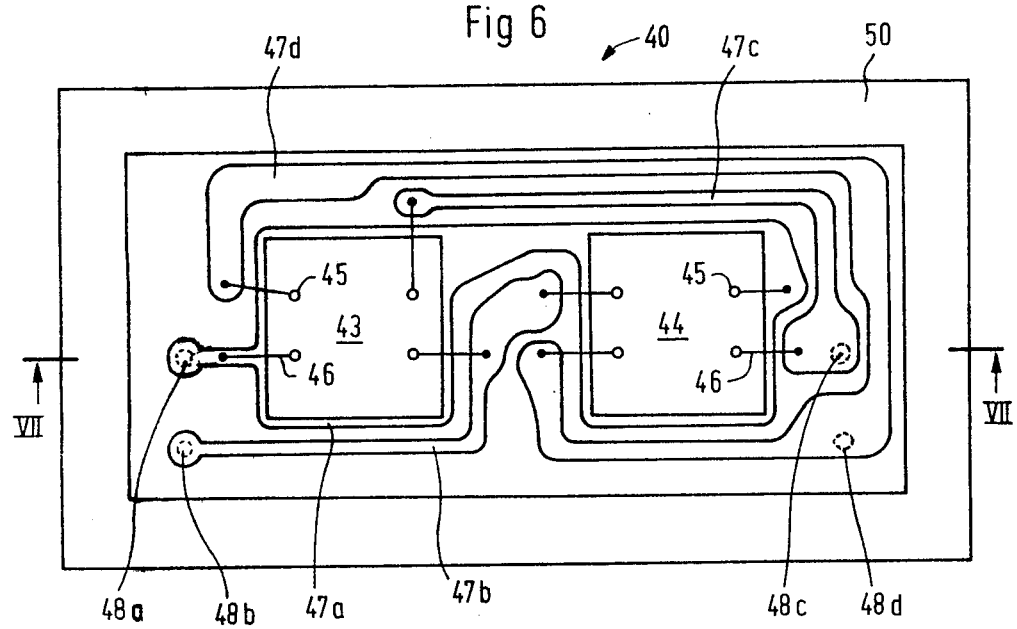
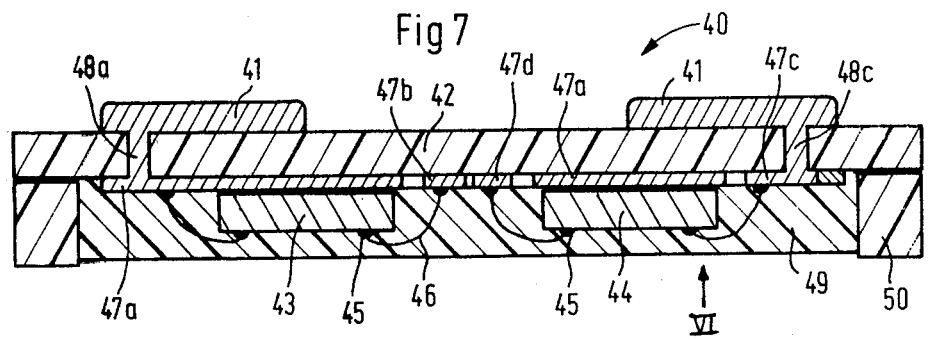
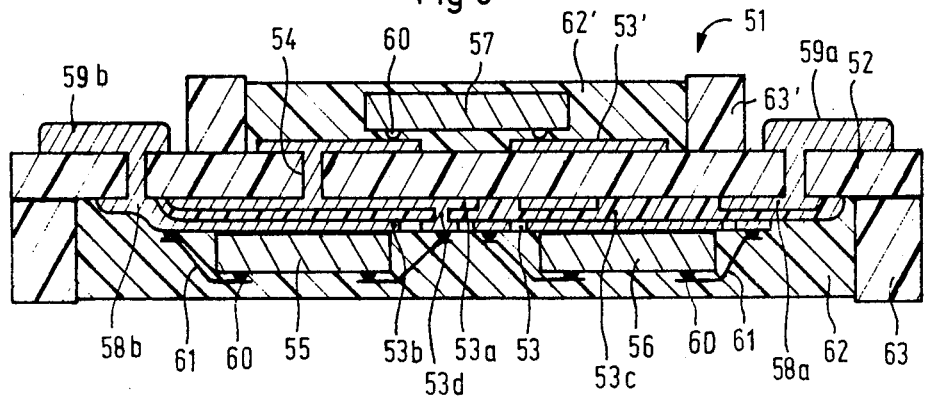

FLAT PACKAGE FOR INTEGRATED CIRCUIT DEVICES

BACKGROUND OF THE INVENTION

1. Field of the Invention

The present invention relates to a flat package integrated circuit device.

2. Description of the Prior Art

Integrated circuit devices, in their initial state, are in the form of tiny chips a few millimeters square having two faces, one of which is defined as the working face. The working face incorporates the electrical circuits and carries output pads which are suitable for connection to conductors. Connection is usually made by soldering, after which the devices may be encapsulated.

Encapsulation protects the devices mechanically and gives them a conventional format which makes them easier to use in complicated electronic structures. Fabrication of such devices necessarily involves the application of each device to a supporting member, the use of output terminals external to the package, the connection of these external terminals to respective output pads of each device via at least one array of conductors, and the encapsulation of the assembly as a whole so as, in particular, to improve its mechanical, thermal and electrical characteristics.

The flat package integrated circuits which have been most widely used in the electronic arts for more than a decade are in the form of a right-angled parallelepiped, bordered longitudinally by two opposing rows of connecting leads which form the output terminals of the package. Because of the arrangement of these leads, the package is normally referred to as DIL ("Dual-In-Line") for DIP ("Dual-In-Line Package"). In actual fact, these leads are the outer ends of converging conductors each terminating at an output pad of the device. The set of conductors, together with the integrated circuit device, are embedded in a plastic or ceramic encapsulation which forms the package itself.

DIL packages currently on the market have a thickness of several millimeters (generally 3 to 4 mm) and an area of at least a square centimeter. However, given the incessant demand for greater miniaturization in many fields of application, manufacturers are being forced to reduce the size of packages. Although it may be possible to cut down the area of DIL packages without any disadvantage this is not true with respect to thickness. To this end, the encapsulation must in fact form a rigid cladding for the two large faces of the integrated circuit chip so that, under flexion, it will not fracture, or, in particular, damage its circuits, and plastic materials and resins are sufficiently rigid only when of relatively large thickness. Thin layers of ceramic material on the other hand crack under flexion. In theory, ceramics should in fact be usable at thicknesses above 0.635 mm but in practice it has been found that the minimum thickness is slightly less than a millimeter. Thus, plastic and resins are not suitable for encapsulation of extremely thin packages and ceramics are generally limited for use at thicknesses of one millimeter and above.

To overcome these disadvantages, manufacturers have replaced the encapsulation, in its capacity of a rigid protective wall, by a metal reinforcement. The non-working face of the device rests in the bottom of a thin metal tray through which pass connecting leads which are insulated from the tray by glass. The inner ends of these leads are connected to the output pads on the working face of the device by flexible wires (using the technique known as wire-bonding) or by beam leads (using the technique known as T.A.B. or "tape automatic bonding"). An encapsulating substance is often used to form the assembly into a solid unit and/or a cover is used to close the tray. It will be apparent that the production of such a package, which is known by the name "flat pack", is very complicated and therefore extremely expensive as compared with a DIL package because of the fact that it is necesary to have a metal tray, to form lateral openings in the tray to form beads of glass in the respective openings and insert the connecting leads in them before the glass beads solidify, to lay down the integrated circuit device in the bottom of the tray, to solder the wires or beam leads to the connecting leads and to the output pads of the device by respective ones of their two ends, to cast the encapsulating substance in the tray and/or to cover the whole article with a cover or a molding.

This form of package has been improved to give the "package carrier". In this design, the tray and the cover, if there is one, are made of ceramic material, which is a good dissipator of heat and relatively malleable. The output terminals which pass through the tray are cast into the ceramic and appear on the outside as lateral pads rather than leads. The package can be connected to an external mounting by insertion in a seating complementary to the surface of the package which is provided with corresponding pads to make contact with those of the package. In one particular known instance, the external mounting is a DIL package in which the "package carrier" type package takes the place of an integrated circuit device.

Although less expensive and smaller in area than the previous package, this package is necessarily thicker since the ceramic material must form a relatively thick layer if it is to have the required rigidity.

Furthermore, large scale integration, LSI, which is currently becoming increasingly widespread in the manufacture of integrated circuits, poses another problem. The concentration in one and the same substrate of circuit components performing different functions means that the resulting device is confined to very specific applications and this, generally speaking, prevents the device in question from being mass-produced. It would be advantageous if a plurality of interconnected, mass-produced integrated circuit devices could be combined, as required by the customer, into a single package which was as compact as possible. The advantages which would be gained are the use of unspecialized low cost devices, the wide choice offered to customers by the combining of the devices, and the possibility of combining integrated circuit devices employing different technologies.

For example, regarding this latter point, at the present time any monolithic integrated circuit device incorporating a memory and a control circuit for the memory is very restricted in its capabilities and it is therefore necessary to use two devices, which perform the memory and memory control functions, respectively, and to interconnect them in order to obtain an assembly of acceptable performance.

The structures of the packages which have been described above are not such as to allow a plurality of devices and the circuit for interconnecting them to be incorporated in one and the same package due to the fact that this would call for the output conductors to cross the interconnecting conductors.

This difficulty has been overcome by replacing, in a package of the flat pack or package carrier type, the integrated circuit device by a carrier wafer containing the integrated circuit devices, their interconnecting circuit, and the output conductors, in the form of printed circuits. The output conductors terminate in connecting islands to which linking conductors leading to the output terminals of the package are soldered.

It was seen above that the thickness of such packages cannot in practice be reduced below a millimeter and that they are more or less complicated and costly to produce. In addition, since the carrier wafer has to rest in the protective tray forming part of the package, the interconnecting circuits and integrated circuit devices must all be carried on the same face of the wafer. Consequently, the interconnecting circuits can only be fitted together or overlapped by spreading them out over a plurality of electrically isolated conductive layers. Ceramic material was the natural choice for the material to form the wafer in view of its good physical electrical and thermal properties, its low cost, the expertise with which printed circuits and soldered joints can now be formed on it, and the advantage offered by the nature of the package that only one face of the wafer is used. However, it is known that the ceramic material must be thick if all the advantages listed above are to be obtained.

In certain particular applications, it is found that the thickness of a package containing one or more integrated circuit devices is a factor of prime importance. This is the case, for example, with the manufacture of standardized portable cards of the credit card type, such as are described in French patent specification No. 2,337,381, corresponding to U.S. Ser. Nos. 751,954 and 4,588 assigned to the assignee of the present invention. The dimensions of such cards are governed by standard ISO/DIS 2894 issued by the International Standards Organization. The cards must therefore be in the form of a rectangle measuring 85.59±0.12 mm×53.97±0.06 mm and must have a thickness of 0.76±0.08 mm, which can be increased by a maximum of 0.05 mm to allow, for example, the name and address of the holder of the card to be shown by means of applied items (such as sticky labels) or by embossing the card itself. To put into practice the invention described in the above patent specification it is therefore necessary for a package which is to be accommodated in a cavity in a card to have a thickness of less than a millimeter. In addition, since the cards are made of a plastic material, usually polyvinyl chloride (PVC), it is also necessary for the package to be relatively flexible, without this flexibility prejudicing the structure or operation of the electrical circuitry which it incorporates. Assuming that the package is to contain a memory component to record the identity of the holder of the card, his confidential code, and the debiting and crediting operations which he is allowed to perform, and a component to be used to control the said memory, the multi-component package described above is quite incapable of meeting the conditions laid down for the credit card. It has also been shown that even if a single monolithic device performing both a memory function and a memory-control function were incorporated in a known single-component package, the package would still be too thick and unusable for standard credit cards.

In other applications, the factor of prime importance will be the area or volume taken up by the package, which will be the crucial factor in deciding whether to use it. However, if the package is to contain a plurality of integrated circuit devices, the surface area required to fit them to one face of the wafer contained in the tray of the package is necessarily large. In other words, the restrictions imposed by the structure of the package are irreconcilable with the demands of size reduction.

SUMMARY OF THE INVENTION

The present invention provides a package for one or more integrated circuit devices whose thickness and/or area can be considerably reduced as compared with the same parameters for prior art packages, and which can be endowed with the requisite flexibility without detracting from the good condition or satisfactory operation of the electrical circuitry incorporated in it.

According to the present invention, a flat package for at least one integrated circuit device having output pads comprises a supporting member for the IC device, a plurality of output terminals external to the package, an array of conductors connecting the said output terminals to the said output pads of the device, and a protective means. The supporting member is a wafer and the output terminals of the package are contact islands arranged on the said wafer. At least those conductors belonging to the array which are attached to the said contact islands rest on the said supporting wafer, and the protective means comprises an electrically insulating encapsulation which partly covers the supporting wafer and which leaves exposed at least the contact islands.

BRIEF DESCRIPTION OF THE DRAWINGS

The features and advantages of the invention will be more clearly apparent from the following description, which is given with reference to the accompanying drawings:

In the drawings:

FIG. 1 is a partly broken-away view from above of a prior art DIL package;

FIG. 2 is a sectional view on line II—II of FIG. 1;

FIG. 3 is a cross-sectional view similar to FIG. 2 of a prior art package of the flat-pack type;

FIG. 4 is a view from above of a prior art package of the package carrier type;

FIG. 5 is a sectional view on line V—V of FIG. 4;

FIG. 6 is a view from above (in the direction of arrow VI shown in FIG. 7) of an embodiment of package according to the invention containing two interconnected integrated circuit devices with the encapsulation material removed for clarity;

FIG. 7 is a sectional view on line VII—VII of FIG. 6;

FIG. 8 is a sectional view similar to FIG. 7 of another embodiment of package according to the invention which contains three interconnected integrated circuit devices arranged on both major faces of the supporting wafer of the package.

The prior art packages which have been descibed and discussed above are illustrated in FIGS. 1 to 5.

They will, therefore, only be described very briefly.

FIGS. 1 and 2 show a prior art DIL package 10 whose external output conductors 11 converge, inside a right-angled parallelepiped insulating encapsulation 12, around a central supporting wafer 13 on which rests an integrated circuit device 14 whose output pads 15 are connected to the inner ends of external output conductors 11 by internal linking conductors 16. The output conductors 11 are divided into two lateral rows symmetrical to the encapsulation 12 and are bent at right angles on two lines 17. As to the linking conductors 16, these may be wires, as illustrated, or beam leads which are angled to allow for the difference in level between the inner ends of the output conductors 11 and the output pads 15 of the device 14.

FIG. 3 shows another known form of flat package IC device. The flat-pack package 20 is substantially similar to the previous package 10. It also resembles the housing 10 when seen from above. In fact, it differs from the previous package only in the means of protection which, instead of being an encapsulation, is a tray in this case. To be more exact, the package 20 has lateral rows of external conductors 21 which form the outlet terminals of the package 20 and which pass through the larger side walls of a rectangular tray 22 via openings 23. The material of the tray 22 is preferably a good dissipator of heat and mechanically strong, such as brass or a ceramic material. Brass has the advantage over ceramics of being sufficiently strong even when thin, but it calls for electrical insulation to be provided between the tray 22 and the conductors 21, for example, in the form of beads of glass filling the openings 23. On the bottom of the tray rests an integrated circuit device 24 whose output pads 25 are connected to the inner ends of the output conductors 21 by linking conductors 26 which may be wires, as illustrated, or beam leads. A cover 27 encloses the assembly and/or an encapsulation 28 fixes the items contained in the tray in position.

FIGS. 4 and 5 relate to a "package carrier" type of package 30. It can be seen that this package has many points of similarity to the previous package 20. The only difference lies in the fact that the output terminals 31 are contacts molded into the side walls of a tray 32 formed from a moldable material which is preferably a good dissipator of heat, such as a ceramic material. A package 30 may have a large number of contacts 31, which usually extend for practically the full height of the package and which advantageously are capable of making contact with respective external contact members 33 around the periphery of a cavity shaped to receive the device 30. As in the case of the package 20, the bottom of the tray 32 of the package 30 carries the integrated circuit device 34 whose output pads 35 are connected to the inner parts of respective contacts 31 by means of linking conductors 36. An encapsulation 37 fixes the items contained in the tray in place and/or a cover (not shown) encloses the items.

The present invention is illustrated in FIGS. 6-8. Referring to FIGS. 6 and 7, there is shown an embodiment of a flat package 40 according to the invention which is intended for two integrated circuit devices. The output terminals of the package 40 are external contact islands 41 which are arranged directly on one face of a wafer 42 which forms a supporting member for the two integrated circuit devices 43 and 44, carried on the other face of the wafer. The output pads 45 of the two devices are connected by respective linking conductors 46 to a set of conductors 47 arranged on said other face of the wafer 42. In the embodiment illustrated, the four conductors 47a to 47d making up the said set form both the interconnecting circuit between the two devices 43 and 44 and the output conductors which lead to respective contact islands 41 (41a to 41d) via holes 48 (48a to 48d) formed in the wafer 42. The means for protecting the devices 43 and 44 is constituted essentially by an electrically insulating encapsulation 49 which partly encapsulates the supporting wafer 42 but which leaves the contact islands 41 exposed. In the embodiment illustrated, the encapsulation 49 is thus applied only to the face of the wafer 42 which carries the devices 43 and 44.

It can at once be readily appreciated that the package 40 may be advantageously of very small thickness. On the one hand, a tray of prior art packages is avoided and on the other hand the output terminals 41 can be provided on the wafer face opposite to that carrying the devices 43 and 44, and at the periphery of the wafer 42 so that they are not covered by the encapsulation 49. What is more, a package of this kind has the advantage of fully exploiting any reduction which can be made in the thickness of the wafer 42. Instead of ceramic material, for example, it is advantageous to use epoxy glass or a plastic material, such as that sold under the name "Kapton", for example. With these two materials, the thickness of the wafer 42 may be below 0.2 mm and package 40 can thus be made with a total thickness which is at the most less than a millimeter. If as a result of the small thickness, package 40 becomes excessively flexible, which would be prejudicial to the satisfactory condition of the housing, increasing the stiffness of the wafer, such as the edging members 50 shown in FIGS. 6 and 7, may advantageously be utilized. These edging members may be added members, or they may be peripheral ribs forming part of the wafer 42. In this way the stiffening means 50 forms part of the means for protecting the package 40. Also, it can be seen in FIG. 6 that the two devices 43 and 44 rest on one and the same conductor 47a, which forms a ground conductor and also acts as a dissipator for the heat released by the devices 43 and 44.

In cases where it is desired to reconcile the dimensions of thickness and area of a package according to the invention, FIG. 8 shows an appropriate embodiment of such a package. In FIG. 8, the package 51 has, on respective ones of the two or major faces of the wafer 52, two interconnecting circuits 53, 53' which are connected together by holes 54 formed in the wafer 52. In the embodiment illustrated, the interconnecting circuits 53 and 53' connect together three integrated circuit devices 55, 56, 57. Also, as a modification to the package 40, interconnecting circuit 53 is made up of two superimposed conductive layers 53a and 53b which are insulated from one another by an insulating layer 53c, except at conductive linking holes 53d. The output conductors, such as conductors 58a and 58b, belonging to the array of conductors arranged on the wafer 52, terminate at the output terminals of the package which are carried by wafer 52, such as terminals 59a, 59b.

Also as a modification of the structure shown in FIG. 7, the output pads 60 of devices 55 and 56 are connected to the interconnecting circuit 53 by angled beam leads 61 instead of by wires 46 as in the case of package 40. It should be apparent that such beam leads could be used in package 40. As for device 57, its output pads 60 are directly connected to conductors belonging to circuit 53' formed o the surface of wafer 52.

The devices 55, 56 and 57 are of course embedded in an encapsulation 62, 62' together with, generally speaking, at least part of the array of conductors formed by circuits 53 and 53' and the linking conductors 61. The encapsulation does not cover the output terminals 59 of the package. Members 63, 63' may be provided along the edges for increasing stiffness, such as in the case of package 40.

The two embodiments of the invention which have been described with reference to FIGS. 6, 7 and 8 will provide those skilled in the art with a good appreciation of the fundamental features of the invention and all the various modifications which can be made. For example, the output terminals of a package according to the invention may be situated on both faces of the wafer, and it goes without saying that such a package may incorporate either a single device or any number of devices. In other words, various modifications will suggest themselves to those skilled in the art and it is not intended by the foregoing description to restrict the invention to the above embodiments. Rather, it is intended to embrace all structures equivalent to the means described and illustrated as well as combinations of these conforming to the accompanying claims to which reference should be made.

I claim:

1. A flat package having at least one integrated circuit device provided with output pads, comprising a wafer for supporting the integrated circuit device, a plurality of output terminals arranged on the wafer forming contact islands external to the package, an array of conductors connecting the said contract islands to the said output pads of the device, at least those conductors of the said array which are connected to the said contact islands being arranged to rest on one major face of the said supporting wafer, and protective means comprises an electrically insulating encapsulation partly encapsulating the supporting wafer so as to encapsulate said array leaving at least the said contact islands exposed.

2. A flat package according to claim 1, wherein the supporting wafer is a thin film of a relatively flexible material such as epoxy glass or a plastic material.

3. A flat package according to claim 2, wherein the said protective means include means for increasing the stiffness of the wafer.

4. A flat package according to any of claims 1, 2 or 3, wherein the supporting wafer carries a plurality of integrated circuit devices, and the said array of conductors comprises an interconnecting circuit printed on said wafer.

5. A flat package according to any of claims 1, 2 or 3, wherein each said device is mounted on one face of the wafer, said contact islands being on the other face, said array of conductors including conductive holes formed in the wafer, and said encapsulation being on the said face of the wafer which carries each said device.

6. A flat package according to claim 4, wherein said devices are mounted on opposite major faces of the wafer; said interconnecting circuit being formed on opposite major faces and conductive holes in the wafer for interconnecting circuits on both major faces, said contact islands being arranged at the periphery of at least one of the said faces of the wafer.

7. A flat package according to claim 6, wherein the conductors belonging to the array which are contained on one face of the wafer are divided among a pluralty of superimposed conductive layers.

8. A flat package according to claims 1, 2 or 3 wherein at least one of the conductors belonging to the array forms a member for dissipating the heat released by each said device.

9. A flat package according to claim 4, wherein each said device is mounted on one face of the wafer, said contact islands being on the other face; said array of conductors including conductive holes formed in the wafer, and said encapsulation being on the said face of the wafer which carries each said device.

10. A flat package according to claim 5, wherein the conductors belonging to the array which are contained on one face of the wafer are divided among a plurality of superimposed conductive layers.

11. A flat package according to claim 5, wherein at least one of the conductors belonging to the array forms a member for dissipating the heat released by each said devices.

12. A flat package as set forth in claims 1, 2 or 3 wherein the total thickness of said package is less than one millimeter.

13. A flat package assembly having at least one integrated circuit device provided with output pads and a total thickness of less than one millimeter comprising a wafer having opposite major faces, said integrated circuit devices being supported on one major face of said wafer with its output pads spaced therefrom, an array of conductors on at least said one major face terminating in contact islands on the other major face of said wafer, linking conductors connecting output pads to respective conductors of the array of conductors, and protective means encapsulating the supporting wafer, integrating circuit device, array of conductors and linking conductors so as to leave the contact islands exposed external to the assembly.

14. A flat package as set forth in claim 13 wherein the supporting wafer carries at least one integrating circuit device on each major face and array of conductors on each major face, said array of conductors being a printed circuit, conductive holes formed in wafer for interconnecting said array of conductors in each major face so as to interconnect said device supported on each major face of the wafer, said contact islands being arranged at the periphery of at least one major face of the wafer.

15. A flat package as set forth in claim 13 or 14 wherein said protective means includes stiffening members about the periphery of said assembly for increasing the stiffness of said wafer.

* * * * *